United States Patent
Yoo et al.

(10) Patent No.: US 6,545,936 B1
(45) Date of Patent: Apr. 8, 2003

(54) PIPELINE STRUCTURE OF MEMORY FOR HIGH-FAST ROW-CYCLE

(75) Inventors: Hoi Jun Yoo, Taejon-si (KR); Chi Weon Yoo, Taejon-si (KR)

(73) Assignee: Korea Advanced Institute of Science & Technology, Taejon-si (KR)

( * ) Notice: Subject to any disclaimer, the term of this patent is extended or adjusted under 35 U.S.C. 154(b) by 0 days.

(21) Appl. No.: 09/807,141

(22) PCT Filed: Sep. 2, 2000

(86) PCT No.: PCT/KR00/00999

§ 371 (c)(1),
(2), (4) Date: Apr. 6, 2001

(87) PCT Pub. No.: WO01/16954

PCT Pub. Date: Mar. 8, 2001

(30) Foreign Application Priority Data

Sep. 2, 1999 (KR) .............................. 99-37216

(51) Int. Cl.[7] ................................. G11C 8/00
(52) U.S. Cl. ................ 365/230.05; 365/230.06; 365/230.08
(58) Field of Search ............... 365/230.05, 189.08, 365/230.03, 230.04, 230.08, 230.06, 189.05

(56) References Cited

U.S. PATENT DOCUMENTS 5,854,770 A * 12/1998 Pascucci ................ 365/230.02
6,018,482 A * 1/2000 Fujita ..................... 365/189.07
6,125,076 A * 9/2000 Ishikawa ................ 365/230.03
6,188,630 B1 * 2/2001 Ohno et al. ............ 365/230.03
6,333,884 B1 * 12/2001 Kato et al. .................. 365/203

OTHER PUBLICATIONS

IEE Journal of Solid–State Circuits, vol. 27, No. 11, Nov., 1992. Title: A 100–MHz 4–Mb Cache DRAM with Fast Copy–Back Scheme, By Katsumi Dosaka et al., pp. 1534–1539.
IEE 1994. Title: Low Latency EDRAM Main Memory Subsystem for 66MHz Bus Operation, By David Bondurant, Ramtrom International Corporation, pp. 250–254.
2000 Symposium on VLSI Circuits Digest of Technical Papers. Title: A Next Generation Channeled–DRAM Architecture with Direct Background–Operation and Delayed Channel–Replacement Techniques, By Yoshikazu Yabe et al., pp. 108–111.

* cited by examiner

Primary Examiner—Michael S. Lebentritt
Assistant Examiner—Hien Nguyen
(74) Attorney, Agent, or Firm—Bachman & LaPointe, P.C.

(57) ABSTRACT

The present invention relates to a DRAM structure for reducing row latency for an irregular row access and for improving the effective bandwidth by varying a DRAM cell core structure, specifically, to a pipeline structure of a memory for a fast row cycle, which is different from a structure used in a conventional fast cycle RAM (FCRAM) and is established by modifying a cell core access in the channel structure of a virtual channel memory (VCM) and by introducing a row buffer and a latch to a decoder.

2 Claims, 7 Drawing Sheets

PIPELINE STRUCTURE OF MEMORY FOR HIGH-FAST ROW-CYCLE

BACKGROUND OF THE INVENTION

1. Field of the Invention

The present invention relates to a DRAM structure for reducing row latency for an irregular row access and for improving the effective bandwidth by varying a DRAM cell core structure. Specifically, the invention relates to a pipeline structure of a memory for a fast row cycle, which is different from a structure used in a conventional fast cycle RAM (FCRAM) and is established by modifying a cell core access in the channel structure of a virtual channel memory (VCM) that has been known to have its performance is improved when applied to a conventional structure and by introducing a row buffer and a latch to a decoder, to secure a sufficient bandwidth for sequential accesses and, simultaneously, to reduce a period of time required for a row path through application of a new technique to obtain short latency, thereby realizing a fast random row cycle.

2. Description of the Related Art

In general, the performance of a DRAM can be represented by a bandwidth and latency. The bandwidth means the amount of information that can be transmitted at a time. The bandwidth is proportioned to the frequency of asignal transmitted and the number of signal lines and it is determined by the column path of the DRAM. Accordingly, it is preferable that the DRAM has as high bandwidth as possible. For this, there have been proposed a variety of methods of making the DRAM column path short. Meanwhile, the latency means a period of time starting from input of a specific address for accessing the DRAM to output of data from the DRAM. The latency is determined mostly by the row path of the DRAM. The DRAM has better performance when the latency is smaller because it is preferable that the data is output fast.

When the DRAM used in a system is sequentially accessed, the maximum bandwidth of the DRAM can be sufficiently used in terms of the structural characteristic of the DRAM. In recent computer systems, however, there has been proposed is an unified memory architecture (UMA) which uses a system memory as a frame buffer for decreasing costs and there exist many masters directly accessing a main memory in a single system, such as cache controller, PCI controller, graphic controller, etc.

Furthermore, the form of memory access becomes irregular with an increase in the number of software developed in a language having a modularized form like C++. In this case, when the latency of the DRAM is longer, a period of time during which data is output for one access becomes longer, resulting in a remarkable reduction in the effective bandwidth. This means that the latency is very important element for telling the performance of the DRAM together with the bandwidth.

The latency of the DRAM is determined by the row path as described above. The row path is restricted by physical factors such as RC time constant of line, compared to the column path affecting the bandwidth so that it is difficult to reduce. Accordingly, there have been proposed various techniques for preventing the latency from being increased or for reducing the latency. These techniques include a multi-bank and access sequence controlling method, a method of using a temporary buffer, an address non-multiplexing and row path pipeline technique and a method of integrating an SRAM in a DRAM.

In the multi-bank and access sequence controlling method, when there are continuous accesses between different banks among multiple banks, page miss penalty is reduced through bank interleaving and the DRAM access sequence is controlled to improve the effective bandwidth. However, this method does not decrease the latency by reducing the time in the row path but puts many banks inside the DRAM to overlap DRAM access operations to thereby obtain an effect equivalent to a reduction in the latency. Accordingly, though the latency is decreased when accesses occur for different banks, the conventional latency is reflected on the output when sequential accesses are required for the same bank. In addition, the multiple inner banks deteriorate noise characteristic.

Furthermore, the aforementioned method of using a temporary buffer is to change the structure of a cell core to directly reduce the time required for the row path, to thereby decrease the latency. This method employs a temporary data buffer to a sense amplifier. Specifically, this technique uses the temporary data buffer to minimize the signal amplitude of a bit line to thereby reduce a pre-charge time and data detection time, and introduces a pipeline concept to the row path to realize the cycle time of 10 nsec for an irregular row access. However, the method of using the temporary buffer is still a conceptual idea so that techniques for operating it are not prepared yet. In addition, this method cannot obtain fast row latency when applied to an actual system because it has problems of restoring data stored in the temporary buffer to the cell core and complexity of a controller for controlling the restoration.

The address non-multiplexing and row path pipeline method is to introduce the pipeline concept to the row path and adopts address non-multiplexing to realize the row cycle of 20 ns. A fast cycle RAM (FCRAM) employs this method. The address non-multiplexing and row path pipeline method selects a sub-wordline structure, reduces the sub-block size of the cell core to decrease the load of a driver driving the cell core and shortens the period of time required for the row path by using a direct sensing method. However, this technique makes the sub-block size very small in order to reduce the cell core access time and adds many additional circuits, resulting in an increase in the area by 30–40%, compared to other DRAM structures having the same integrity. Furthermore, it uses the non-multiplexing method as an address input method so that it cannot be compatible with existing systems in terms of interface, for example, the number of pins for address input. Moreover, since its data outputting method is different from the conventional DRAM structure, an additional interface circuit is required to the data output port in order to apply this method to a system currently being used.

Finally, the method of integrating an SRAM in a DRAM, which is different from the above-mentioned three methods, is to integrate the SRAM in the DRAM to secure a sufficient bandwidth even for an irregular row access. This basically uses temporal and spatial locality of a memory access pattern. Specifically, the SRAM integrated together with the DRAM is used as a data buffer and the operations of the cell cores of the SRAM and DRAM are separated from each other to be capable of operating simultaneously, thereby reducing the latency due to page miss and improving the effective bandwidth. An enhanced synchronous DRAM (ESDRAM), cache DRAM (CDRAM), wide CDRAM and virtual channel memory (VCM) employ this method. There is described below the technical background and features of the VCM structure that has been known to have its performance improved when applied to the conventional structure for the purpose of securing a sufficient bandwidth for sequential accesses and reducing the time required for the row path through application of a new technique to obtain a short latency.

The VCM, proposed by NEC Co. of Japan, is constructed in a manner that an SRAM buffer is integrated in a DRAM, similar to the ESDRAM and CDRAM structures, to increase the effective bandwidth using the SRAM buffer. The integrated SRAM buffer is called "channel", and the operation of the DRAM cell core and the operation of the SRAM buffer are separated from each other through this channel to conceal the pre-charge time due to page miss as in the ESDRAM and CDRAM. However, the VCM controls data transmission between the SRAM and DRAM through an external control while the ESDRAM and CDRAM perform a control for data transmission and consistency maintenance between the SRAM and DRAM cores using a controller integrated together with the SRAM in the DRAM. The VCM has relatively simple structure because a logic part for the control is not included in the DRAM. Thus, it is known that the increase in the area of the VCM caused by the integration of SRAM is 3% approximately. When the control can be appropriately executed externally, the VCM can optimize the operations of the SRAM and DRAM and data transmission between them to conceal the most part of the latency due to page miss. Moreover, each memory master is assigned a row data buffer of its own to control the row data buffer independently so that the VCM can appropriately correspond to a system in which multiple memory masters exist.

FIG. 1 shows the configuration of a conventional VCM. The VCM (including ESDRAM and CDRAM) does not shorten the row path time basically but separates the operation of the cell core and the operation of the channel (SRAM) from each other through the SRAM to overlap them and allows multiple accesses to be processed fast by the channel (SRAM), to obtain an effect equivalent to a reduction in the latency. When a write miss occurs in the channel (that is, when desired data does not exist on sixteen channels), though there is a method of selecting one of the sixteen channels, eliminating the data therein and reading new data, the VCM shown in FIG. 1 does not access the channel as far as possible but uses a dummy channel for transmitting data to the cell core instantly. The dummy channel is used in "read modified write" mode that a segment required for the cell core is read, data to be written is recorded and then the data is written to the cell core. When there are sequential write misses or two write misses occur for the same segment, data is read into the dummy channel for the first write miss, the second write miss data is written and then corresponding segment is modified-written to the cell. When write misses occur for different segments, it is required to read a segment for each write miss and write it.

Accordingly, since the VCM separates the operation of the cell core and the operation of the channel (SRAM) from each other to overlap them and allows multiple accesses to be processed fast by the channel (SRAM) to obtain the effect equivalent to a reduction in the latency, when sequential accesses of the DRAM cell core is needed due to continuous channel misses, the conventional long latency appears on the output. Furthermore, because data is not output from the cell core directly but output through the channel, the latency may become longer than that of the conventional structures. That is, the entire performance is restricted by the background operation accessing the cell core.

When write misses occur continuously for different segments, especially, since the VCM processes them through the dummy channel, it should access the cell core twice for is one write miss. Moreover, the VCM cannot perform other background operations during access of the dummy channel because of its structure. Thus, the latency becomes long considerably in case where the background operation is required to continue due to continuous write misses. While the VCM activates the entire rows for processing a single segment, though there is no problem when other three segments other than a segment being used are used for the next access, other segments activated together with the segment being used are not used because of characteristics of memory access. This consumes power unnecessarily.

SUMMARY OF THE INVENTION

It is, therefore, an object of the present invention to provide a pipeline structure of a memory for fast row cycle, which is different from the pipeline structure used in the conventional FCRAM and is obtained by varying the cell core access method in the conventional VCM channel structure and introducing a row buffer and a latch to a decoder, to make even a random row cycle fast.

To accomplish the object of the present invention, there is provided a memory having a pipeline structure in a row path, which has a memory cell array in which a plurality of memory cell cores capable of storing logic states of electric signals are arranged in N columns and M rows and is able to perform an operation of reading or writing data stored in a corresponding cell core by enabling the addresses and bit lines of each of the memory cell cores arranged in columns or rows, in which the address lines of the memory cell array are grouped by a predetermined number, a main address line representative of each address line group and the address lines forming each group are constructed of sub-address lines of corresponding main address line, address data is received from a specific control system to access the main address line, and the sub address lines included in the accessed main address line are selected.

To accomplish the object of the invention, there is also provided a memory having a pipeline structure in a row path, which has a memory cell array in which a plurality of memory cell cores capable of storing logic states of electric signals are arranged in N columns and M rows and is able to perform an operation of reading or writing data stored in a corresponding cell core by enabling the addresses and bit lines of each of the memory cell cores arranged in columns or rows, in which the address lines of the memory cell array are grouped by a predetermined number, a main address line representative of each address line group and the address lines forming each group are constructed of sub-address lines of corresponding main address line, the memory including: a buffer for receiving address decoding data from a specific control system to temporarily store it; row detection means for detecting an address row requested by the control system from the address decoding data output from the buffer; a main address line driver for driving a main address line corresponding to data with respect to the address row requested by the control system; and a latch, located on a signal transmission path between the row detection means and the main address line driver, for separating address decoding and cell core access operations from each other.

To accomplish the object of the invention, there is provided a memory having a pipeline structure in a row path, which has a memory cell array in which a plurality of memory cell cores capable of storing logic states of electric signals are arranged in N columns and M rows and is able to perform an operation of reading or writing data stored in a corresponding cell core by enabling the addresses and bit lines of each of the memory cell cores arranged in columns or rows, in which the address lines of the memory cell array are grouped by a predetermined number, a main address line representative of each address line group and the address lines forming each group are constructed of sub-address lines of corresponding main address line, the memory including: a buffer for receiving address decoding data from a specific control system to temporarily store it; a row detection means for detecting an address row requested by the control system from the address decoding data output from the buffer; a main address line driver for driving a main address line corresponding to data with respect to the address row requested by the control system; a latch, located on a signal transmission path between the row detection means and the main address line driver, for separating address decoding and cell core access operations from each other; and a row buffer placed between a sense amplifier connected to a data bit line of each cell core constructing the memory cell array and a data input/output channel, the row buffer separating data detection and data transmission operations from each other.

DETAILED DESCRIPTION OF THE PREFERRED EMBODIMENT

Figure 1:
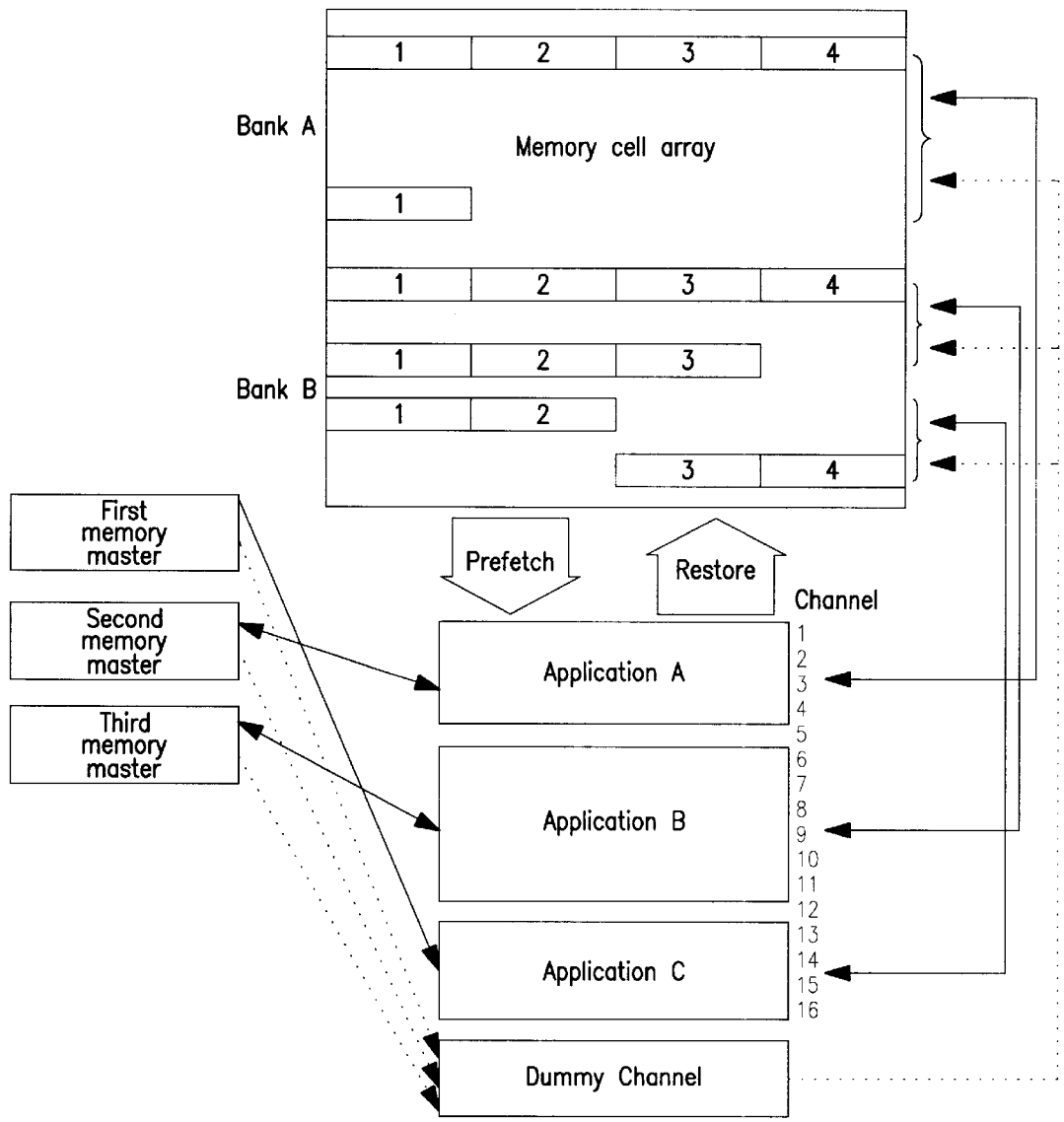
FIG. 1 shows the configuration of a conventional VCM.

Reference will now be made in detail to the preferred embodiments of the present invention, examples of which are illustrated in the accompanying drawings.

To reduce row latency for an irregular row access by varying the DRAM cell core structure to improve the effective bandwidth, the present invention basically uses the VCM channel structure that is known to have improved performance that its area is increased by a small amount of about 3% when applied to the conventional structure to maintain the block with a sufficient size, channel hit rate and flexibility to realize a large bandwidth for sequential accesses. The present invention proposes a pipeline structure, different from that used in the convention FCRAM, by varying the cell core accessing method in the VCM and introducing a row buffer and a latch to a decoder in order to solve the problem that the performance of the VCM is restricted by the background operation (cell core access), to thereby make even a random row cycle fast. Furthermore, the invention employs address multiplexing without any change so as to maintain compatibility with existing systems in terms of interface with external systems, and improves the address input method to increase address bus utilization efficiency. Moreover, the invention uses a sub-wordline structure to partially activate the DRAM cell core to reduce the number of sense amplifiers driven at a time, thereby realizing low consumption power.

The conventional VCM channel has the size of 1 Kbit, and a total of seventeen channels are included in the DRAM. Sixteen of the seventeen channels can be externally read and written so that it can be said that an SRAM having the capacity of 16 Kbit is integrated in the VCM. The channels are arranged between a sense amplifier of the cell core and an external input/output unit and they can transmit data to the outside of the memory or the cell core.

Data transmission between the cell core and channels is carried out through a wide inner bus at a time with the cell core being divided into units each of which corresponds to 1 Kbit (this unit is called a segment). A single row (4 Kbit) is currently divided into four segments. The cell core access cannot be executed externally but it can be carried out only through the channels. The data transmission operation between the cell core and channels is called a background operation and the transmission operation between the channels and an external interface is called a foreground operation. The foreground operation and background operation can be separated from each other as in the EDRAM and CDRAM so that they can be simultaneously performed in parallel. The VCM is not for improving the cell core structure but for integrating the SRAM to improve the interface with external systems, as described above. Thus, it can be combined with other memory techniques such as RDRAM, SDRAM, etc.

The sixteen channels are fully associative because their operations and characteristics can be independently controlled by an external controller. In case that multiple memory masters exist in a system, a specific channel can be assigned to each memory master to be individually controlled. One channel among the seventeen channels other than the sixteen channels is called "dummy channel" that is a dedicated channel for a writing operation. Only the writing operation can be externally performed for this dummy channel.

The present invention adds technical characteristics of realization of a fast row path, variation in write miss processing and partial activation to the aforementioned VCM technique. The realization of a fast row path is accomplished by introducing a pipeline concept to the row path of the VCM. This solves a problem that the entire performance of the VCM is restricted by the background operation because the VCM structure is not for making the row path fast basically but for processing lots of accesses through its channels using the SRAM buffer to improve its performance.

The technique of varying the write miss processing in the present invention reduces the number of times of cell core accesses to one-time in the event of occurrence of a write miss using a dummy channel access in "write through" form not "read modified write" form in a write miss cycle in order to solve the problem that the cell core access is executed twice for processing continuous write misses when these continuous write misses are not for the same segment because the conventional VCM accesses the dummy channel in "read modified write" form. Furthermore, the partial activation technique of the present invention partially activates the cell core in segments to reduce unnecessary power consumption in the VCM.

Reference will now be made in detail to the preferred embodiments of the present invention, examples of which are illustrated in the accompanying drawings.

Figure 2:
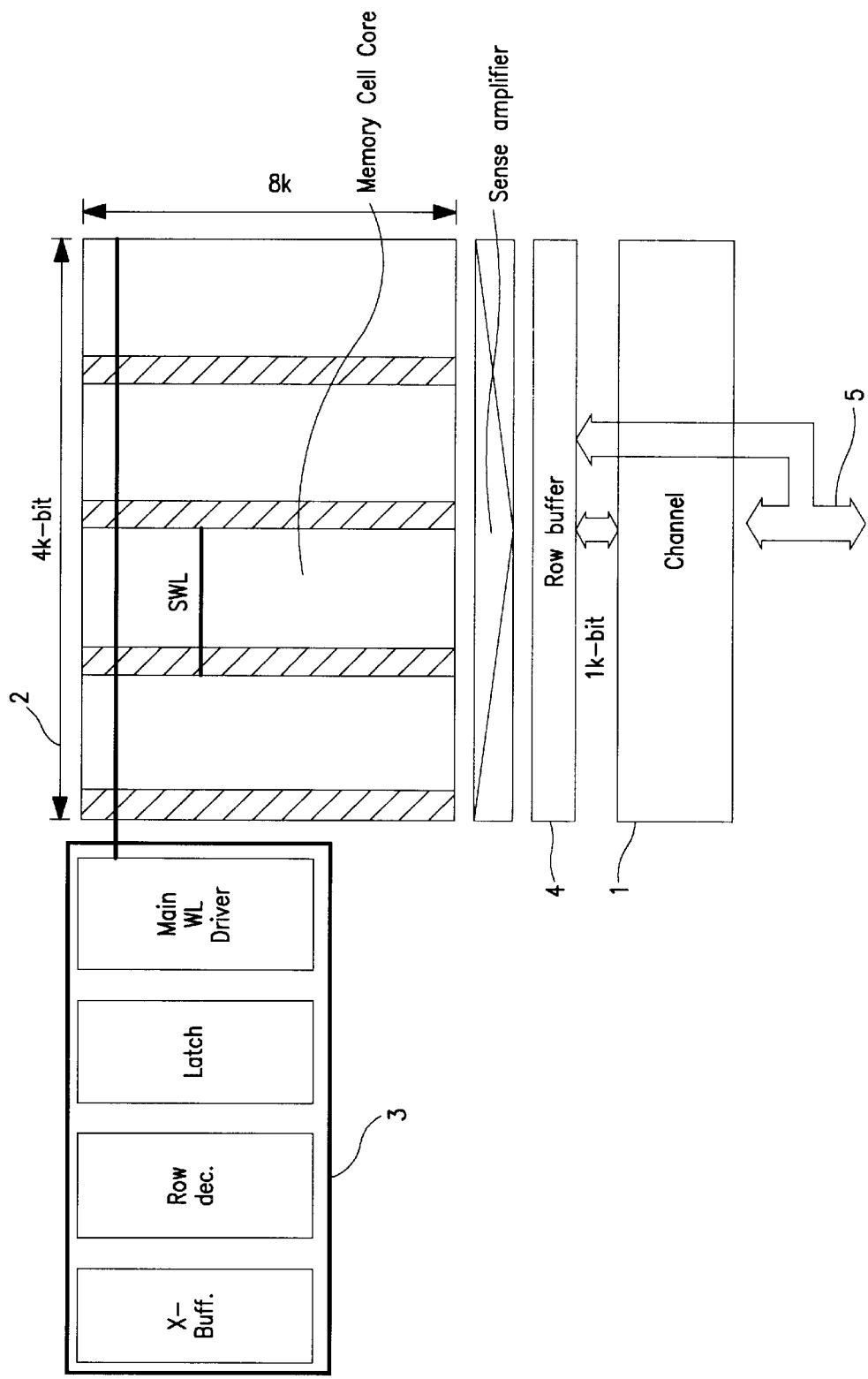
FIG. 2 shows the conceptual configuration of a memory according to the present invention.

FIG. 2 shows the configuration of the memory according to the present invention. Referring to FIG. 2, the memory is roughly divided into a channel 1, a partial activation unit 2, a pipeline structure 3 in the row path, a row buffer 4 and a data input/output unit 5. The channel has the size of 1 Kbit and sixteen channels are integrated in the memory. These channels are similar to those of the VCM. However, the dummy channel is not the one used in the VCM but the row buffer 4 placed under a sense amplifier serves as the dummy channel. The partial activation unit 2 partially activates rows in segments required for one time, not activates the entire rows in the VCM when data is transmitted from the cell core to the channels. In this case, the number of times of data detection operation is reduced to a quarter of that in the conventional case so that power unnecessarily consumed can be decreased and performance deterioration barely occurs because of characteristics of cell core access pattern. Here, it is assumed that there is no delay time, tRCD, between an X address and Y address while the sub-wordline structure is used for the cell core and a latch is introduced to the output terminal of a main decoder to maintain compatibility with existing systems for address input.

Meantime, the present invention employs the pipeline structure 3 for the row path in order to make continuous cell core access time fast. An operation for constructing the row path includes an address input and decoding operation, a data detection and restoring operation through the cell core access, and a pre-charge operation for preparing the next access. Among these, the data detection and pre-charge operations are sequentially executed to the cell core directly and they cannot be separated from each other. The address decoding operation and the cell core operation can be overlapped with each other when the cell core is separated from a decoding logic. Accordingly, the present invention inserts the latch to the output port of the main decoder logic in a hierarchical wordline scheme to separate the address decoding operation and the cell core operation from each other. Moreover, the invention introduces the row buffer to the output terminal of the sense amplifier to separate the operation of data transmission between the cell core and the channels from the cell core access operation.

The row buffer 4 stores data between the sense amplifier and the channels. This row buffer 4 is introduced to separate the data detection operation and data transmission operation through the sense amplifier from each other and construct the pipeline in the row path. The row buffer exists for the segment of each bank as in the ESDRAM and it is placed right under the sense amplifier. That is, the row buffer transmits data detected through the sense amplifier to the channels in case of transmission of data from the cell core to the channel to reduce the load the sense amplifier should drive. In addition, the row buffer serves as a buffer for storing data in advance to allow the data transmission and cell core detection operations to be carried out simultaneously in case of transmission of data from the channels to the cell core.

Meanwhile, a path through which the row buffer can be externally accessed directly is placed so that the row buffer is used as a data buffer in the event of write miss in the channels. In this case, the row buffer serves as the dummy channel of the VCM structure. For this, the row buffer additionally requires an Y address decoder capable of controlling each bit. The structure of the row buffer is the same as that of a general SRAM cell, which is configured of cross-coupled inverters.

The data input/output unit 5 has a data path for externally accessing the row buffer directly when a write miss occurs in the channels. The present invention has the same data input/output configuration and interfaces as those of the conventional DRAM cell core because the memory structure of the invention is obtained by improving the conventional DRAM cell core structure. Accordingly, the present invention can also maintain compatibility with existing interfaces, as does the VCM.

The entire operation of the memory of the invention according to operation modes will be described below. The explanation for the foreground operation will be omitted because the memory structure of the invention uses the VCM channel structure so that the foreground operation performed in the channels is the same as that of the VCM, and only the background operation will be explained since the present invention relates to improvement of the background operation carried out in the VCM.

Figure 3A:
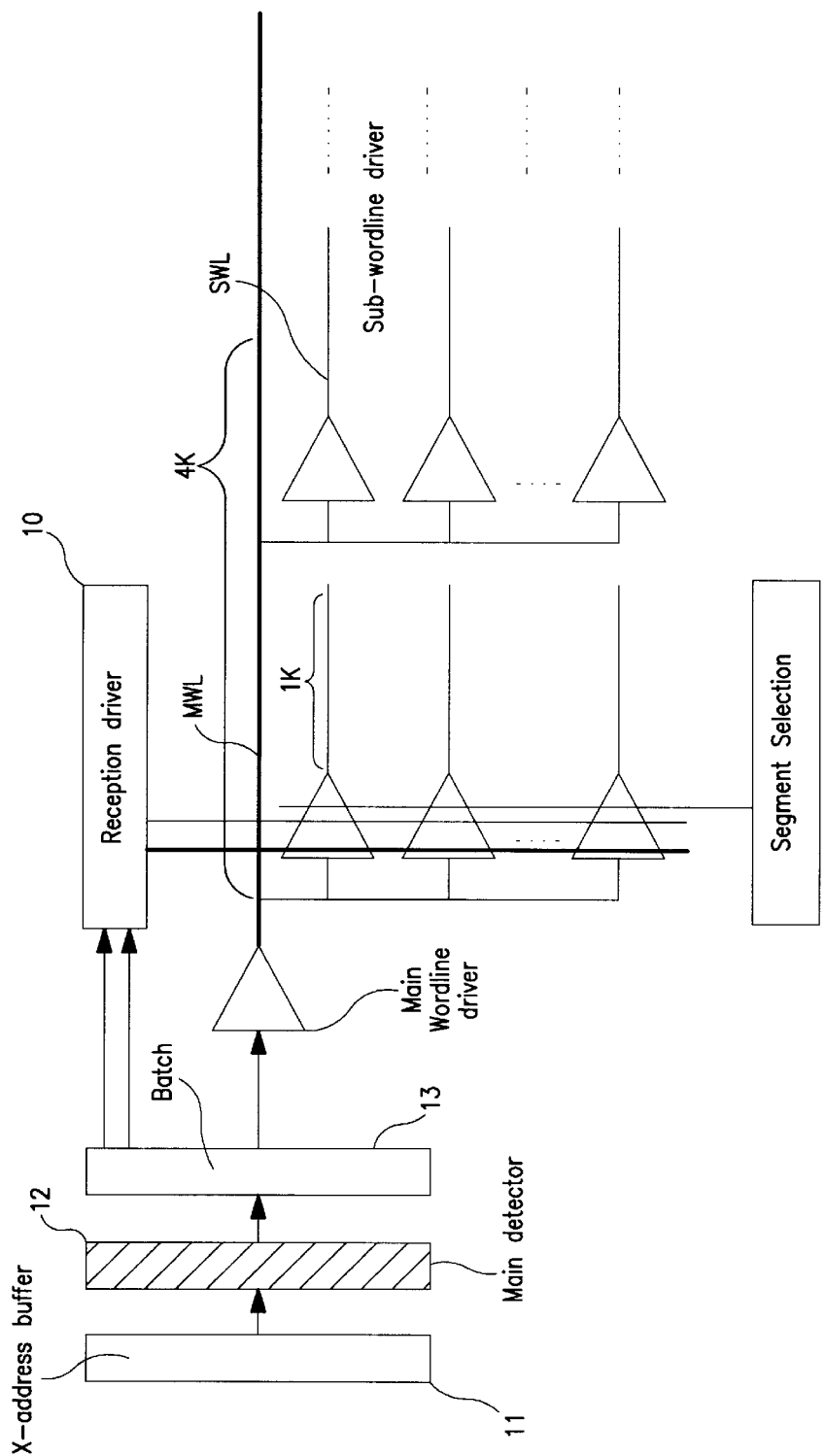
FIGS. 3A, 3B and 3C show the concept of a memory cell core according to the present invention.
Figure 3B:
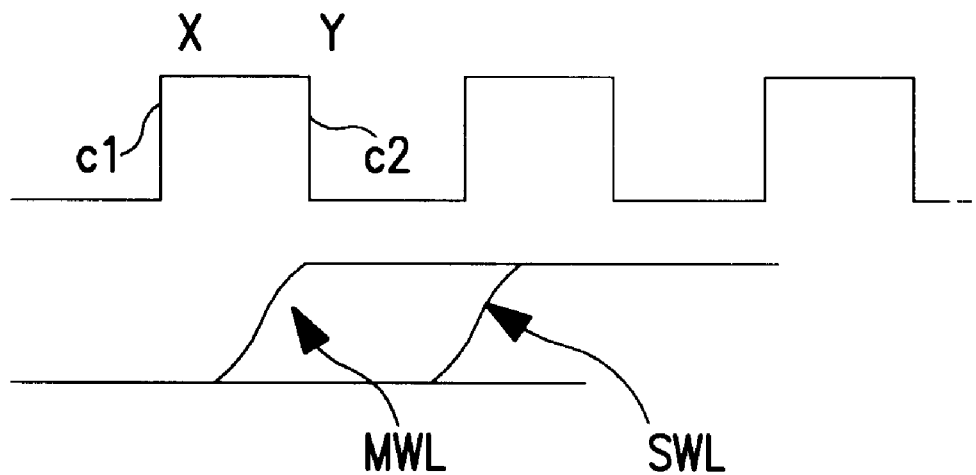
Figure 3C:
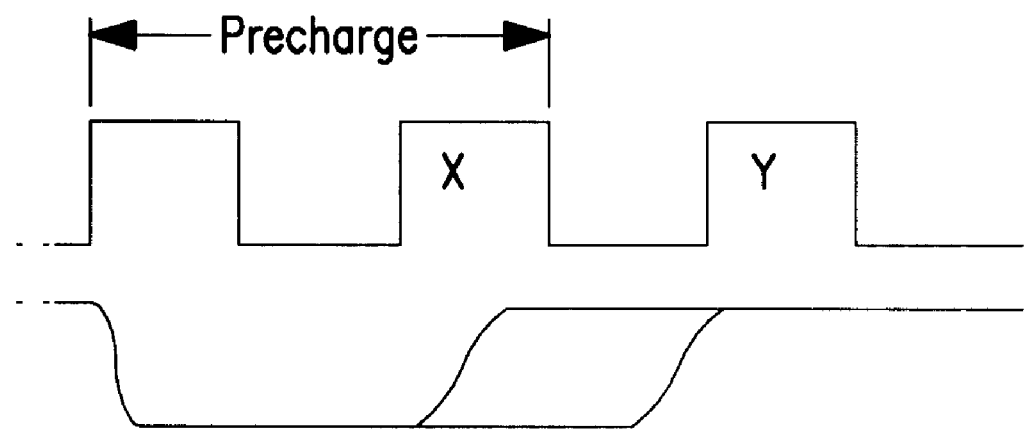

FIGS. 3A, 3B and 3C illustrate the concept of the cell core according to the present invention. Four sub-wordlines SWL are selected for one main wordline MWL, each sub-wordline taking charge of the segment with the size of 1 Kbit conceptually. While one sub-wordline selected by a reception driver is driven right after the main wordline is driven in a general sub-wordline structure, the sub-wordlines are driven only for a specific segment using information obtained from an Y address following after an X address for partially driving the cell core for the specific segment in the present invention.

Referring to FIG. 3A, a latch 13 is introduced to the output terminal of a main detector 12 that is the X decoder to separate the cell core access from the operation of decoding the X address introduced through an X-address buffer 11. That is, the present invention partially activates the cell core in segments each of which has the size of 1 Kbit using the latch 13 placed at the output terminal of the X address main detector 12 and the hierarchical wordline scheme. For this, it is assumed in the memory structure of the invention that addresses are respectively input at different points of time in the operation mode while maintaining the compatibility with existing interface structures using address multiplexing used in the SDRAM and VCM. Accordingly, it is assumed that the Y address is supplied from the controller right after input of the X address without having the time delay tRCD in the present invention though the Y address for selecting a column is input after the lapse of time delay tRCD (RAS to CAS delay) after the X address for selecting a row is input in the conventional SDRAM or VCM.

Referring to FIGS. 3B and 3C which illustrate the cell core access procedure with the lapse of time, when the X address is accepted by the buffer 11 at a clock edge C1, the address is instantly decoded and the decoded result is stored in the latch 13 connected to the output terminal of the main detector 12, separating the cell core access and address decoding paths from each other. The main wordline MWL starts to be driven by the X address value stored in the latch 13. Then, when the Y address is received at a clock edge C2, two upper bits of the Y address are decoded in order to judge a portion of the four segments which will be partially activated, to active a sub-wordline SWL with respect to a specific segment. Accordingly, actual cell core access occurs after input of the Y address.

While an X address for the next access can be received after completion of pre-charge operation for the cell core in the conventional structure, the X address for the next cell core access can be input during execution of the pre-charge operation in the cell core because the cell core data access does not start instantly by the X address in the structure of the present invention (Referring to FIG. 3C).

Figure 4:
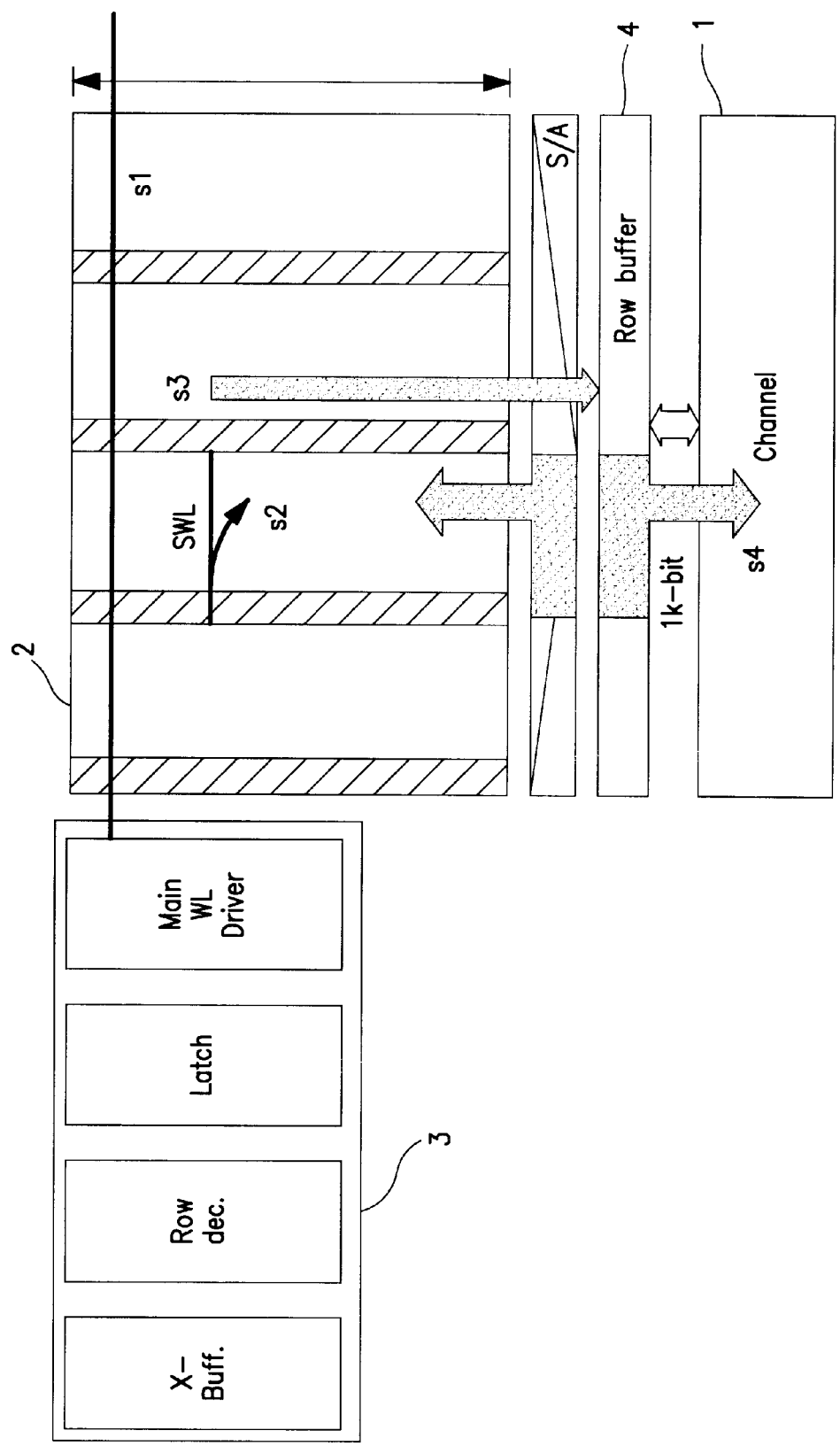
FIG. 4 is a diagram for explaining the reading operation of the cell core in the memory according to the present invention.

FIG. 4 is a diagram for explaining the reading operation of the cell core in the memory according to the present invention. The operation of transmitting data from the cell core to the channels is described below with respect to FIG. 4

When the addresses are received according to the aforementioned sequence for the cell core access, the cell core access starts after input of the Y address (S1). Then, when a potential with a predetermined level is formed at a bit line by the sense amplifier S/A (S2), a transmission switch is opened to transmit data detected to the row buffer 4 placed right under the sense amplifier (S3). Thereafter, the transmission switch is shut to separate the sense amplifier and the row buffer 4 from each other so that the cell restoring operation in the cell core and operation of transmitting data to the channels are performed in parallel through the sense amplifier and the row buffer 4, respectively (S4). That is, the row buffer 4 reduces the load that the sense amplifier should directly restore the data of channels to shorten the period of time required for the cell core access.

Figure 5:
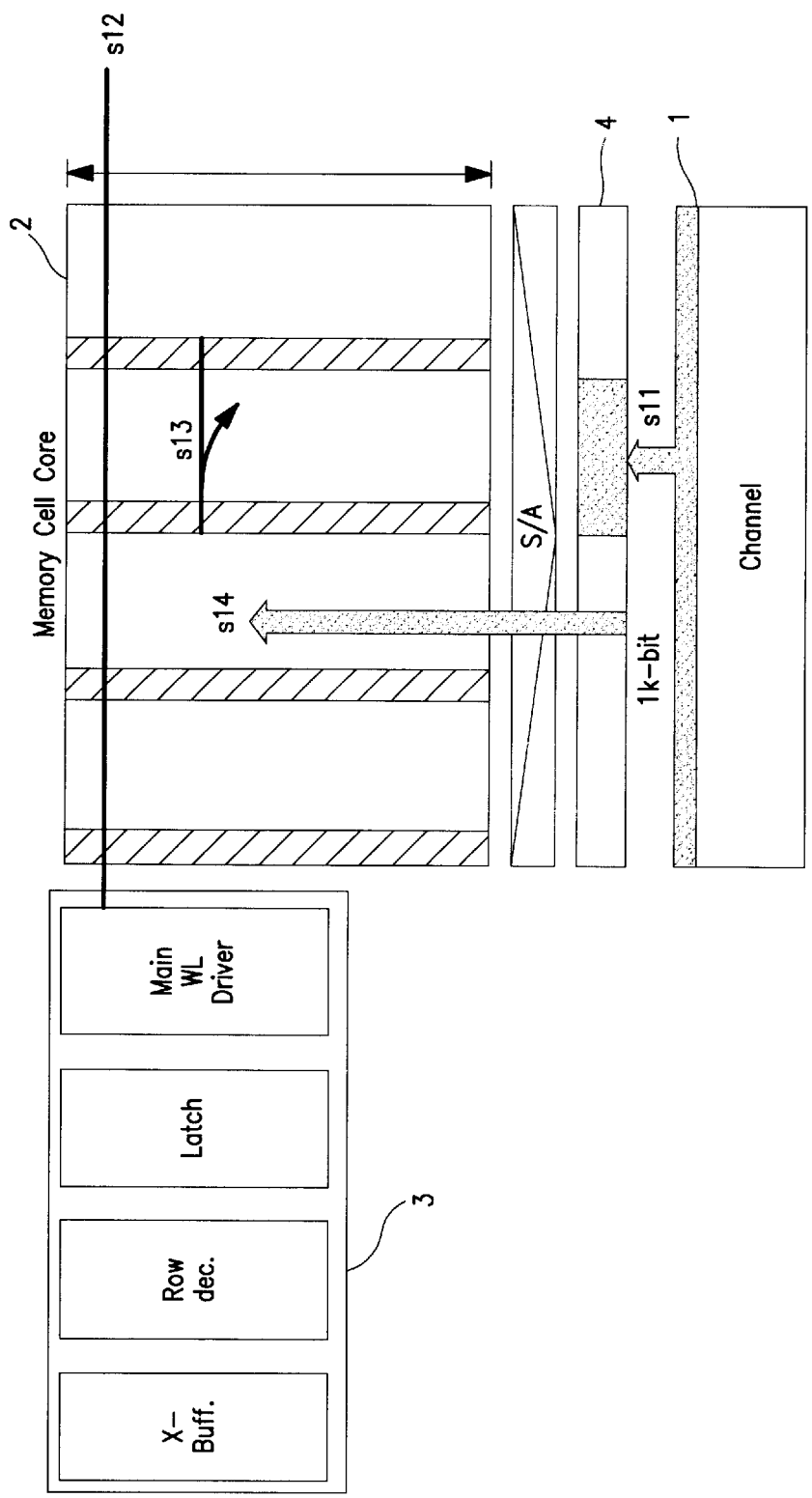
FIG. 5 is a diagram for explaining the data restoring operation of the cell core in the memory according to the present invention.

FIG. 5 is a diagram for explaining the data restoring operation in the cell core of the memory according to the present invention. The operations of the channels and cell core are separated from each other by the row buffer 4 to be executed independently, as described above. In a restoration cycle, the number of a channel for which data restoration will be carried out, the location of a bank at which data will be placed, and segment information of corresponding bank are received from an external controller at a clock edge to start to transmit the channel data to the row buffer 4 before execution of the cell core access (S11). At the next clock, the X address of a bank to be activated is received to start the cell core access (S12). In the restoration cycle, as distinguished from the reading cycle, the main wordline MWL and sub-wordlines SWL can be sequentially activated after input of the X address without waiting for input of the Y address because the information about the segment to be activated was obtained in advance before the X address.

At the point of time at which driving of the sub-wordlines for corresponding segment is finished and cell data is charge-shared to the bit line, all the channel data has been already transmitted to the row buffer. After this, the bit line and the row buffer are connected to each other to transmit the data stored in the row buffer to the bit line and the sense amplifier is activated to drive the bit line. Meantime, since the row buffer 4 can serve as the sense amplifier in terms of circuit, the connection between the sense amplifier and the row buffer 4 is kept and the bit line is driven together with the sense amplifier S/A to improve driving capability. This shortens the cell data restoration time.

Figure 6:
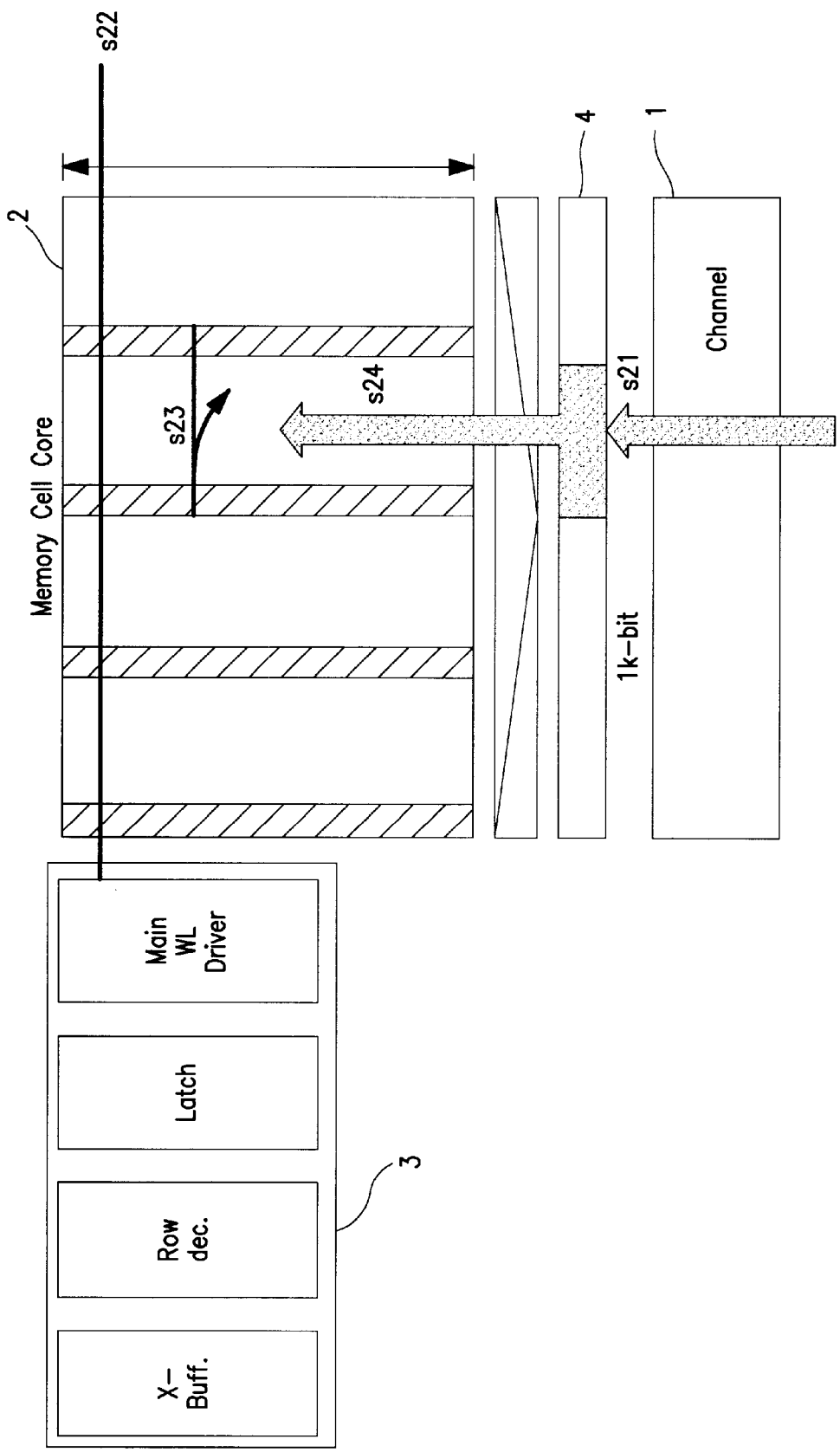
FIG. 6 is a diagram for explaining the data writing operation of the cell core in the memory according to the present invention.

FIG. 6 is a diagram for explaining the data writing operation of the cell core in the memory according to the present invention. The invention uses "write though" mode not "read modified write" mode for a channel write miss cycle. That is, the present invention simultaneously performs the cell core access operation and an operation of externally transmitting data corresponding to a write miss. As described in the restoration cycle, the locations of a bank and segment at which data to be written and an Y address corresponding there to are prepared and the data to be written is also provided, to be placed in the row buffer in advance before the X address is input for the cell core access. Meantime, the X address is received while the data is externally input to execute the cell core access simultaneously. After the lapse of the point of time at which the data transmission is finished or at which the cell core data is charge-shared to the bit line according to a burst length, the row buffer 4 and the sense amplifier are connected to each other to transmit the data stored in the row buffer to the cell core.

It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:

1. A memory having a pipeline structure in a row path, which has a memory cell array in which a plurality of memory cell cores capable of storing logic states of electric signals are arranged in N columns and M rows and is able to perform an operation of reading or writing data stored in a corresponding cell core by enabling the addresses and bit lines of each of the memory cell cores arranged in columns or rows, wherein the address lines of the memory cell array are grouped by a predetermined number, a main address line representative of each address line group and the address lines forming each group are constructed of sub-address lines of corresponding main address line, the memory including:
a buffer receiving address decoding data from a specific control system temporarily store it;
row detection means for detecting an address row requested by the control system from the address decoding data output from the buffer;
a main address line driver for driving a main address line corresponding to data with respect to the address row requested by the control system; and
a latch, located on a signal transmission path between the row detection means and the main address line driver, for separating address decoding and cell core access operations from each other.

2. A memory having a pipeline structure in a row path, which has a memory cell array in which a plurality of memory cell cores capable of storing logic states of electric signals are arranged in N columns and M rows and is able to perform an operation of reading or writing data stored in a corresponding cell core by enabling the addresses and bit lines of each of the memory cell cores arranged in columns or rows, wherein the address lines of the memory cell array are grouped by a predetermined number, a main address line representative of each address line group and the address lines forming each group are constructed of sub-address lines of corresponding main address line, the memory including:
a buffer for receiving address decoding data from a specific control system to temporarily store it;
a row detection means for detecting an address row requested by the control system from the address decoding data output from the buffer;
a main address line driver for driving a main address line corresponding to data with respect to the address row requested by the control system;
a latch, located on a signal transmission path between the row detection means and the main address line driver, for separating address decoding and cell core access operations from each other; and
a row buffer placed between a sense amplifier connected to a data bit line of each cell core constructing the memory cell array and a data input/output channel, the row buffer separating data detection and data transmission operations from each other.

* * * * *